(12) United States Patent
Gossner et al.

(10) Patent No.: US 8,072,061 B2
(45) Date of Patent: Dec. 6, 2011

(54) SEMICONDUCTOR DEVICE WITH COOLING ELEMENT

(75) Inventors: Harald Gossner, Riemerling (DE); Christian Russ, Diedorf (DE); Thomas Schulz, Heverlee (BE); Jens Schneider, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/720,700

(22) Filed: Mar. 10, 2010

(65) Prior Publication Data

US 2010/0163995 A1 Jul. 1, 2010

Related U.S. Application Data

(63) Continuation of application No. 11/561,170, filed on Nov. 17, 2006, now Pat. No. 7,678,632.

(51) Int. Cl.
*H01L 23/34* (2006.01)
(52) U.S. Cl. ......................... 257/720; 257/722
(58) Field of Classification Search .................. 257/379, 257/401, 720, 722; 438/197
See application file for complete search history.

(56) References Cited

U.S. PATENT DOCUMENTS

| | | | |
|---|---|---|---|
| 5,850,099 A | 12/1998 | Liu | |
| 2002/0033189 A1 | 3/2002 | Macris | |
| 2003/0160233 A1 | 8/2003 | Rendon et al. | |
| 2003/0189231 A1 | 10/2003 | Clevenger et al. | |
| 2004/0150029 A1 | 8/2004 | Lee | |
| 2005/0133829 A1 | 6/2005 | Kunii et al. | |
| 2005/0167849 A1* | 8/2005 | Sato | 257/778 |
| 2007/0010049 A1* | 1/2007 | Anderson et al. | 438/197 |
| 2007/0023892 A1 | 2/2007 | Gauche et al. | |
| 2008/0111163 A1* | 5/2008 | Russ et al. | 257/280 |

* cited by examiner

*Primary Examiner* — Thao P. Le
(74) *Attorney, Agent, or Firm* — Infineon Technologies; Philip H. Schlazer (57) ABSTRACT

Some embodiments discussed herein include a semiconductor having a source region, a drain region and an array of fins operatively coupled to a gate region controlling current flow through the fins between the source region and the drain region. The semiconductor also has at least one cooling element formed at least in part of a material having a heat capacity equal to or larger than the heat capacity of the material of the source region, drain region and array of fins, the cooling elements being in close vicinity to fins of the array of fins electrically isolated from the fins of the array, the source region and the drain region.

32 Claims, 7 Drawing Sheets

SEMICONDUCTOR DEVICE WITH COOLING ELEMENT

RELATED APPLICATION INFORMATION

This application is a continuation application of U.S. patent application Ser. No. 11/561,170 filed on Nov. 17, 2006. U.S. patent application Ser. No. 11/561,170 is hereby incorporated by reference herein.

TECHNICAL FIELD

The information disclosed herein relates generally to integrated circuit devices and fabrication methods, including semiconductor devices and methods of forming such devices.

BACKGROUND

Multigate (MuGFET) or FinFET devices are expected to be used in the future due to the difficulty of further downscaling of bulk CMOS technologies. Such devices may typically be designed for high-speed logic core applications with low supply voltages. It is necessary for such devices to be able to operate following Electrostatic Discharge (ESD) events.

DETAILED DESCRIPTION

Many of the various disclosed embodiments relate to semiconductor devices and methods of fabricating such devices, and in particular to MuGFETs or FinFETs. Specific details of certain embodiments of the invention are set forth in the following description and in FIGS. 1 through 12 to provide a thorough understanding of such embodiments. One skilled in the art, however, will understand that other embodiments are possible, and that many embodiments may be practiced without several of the details described herein.

Figure 1:
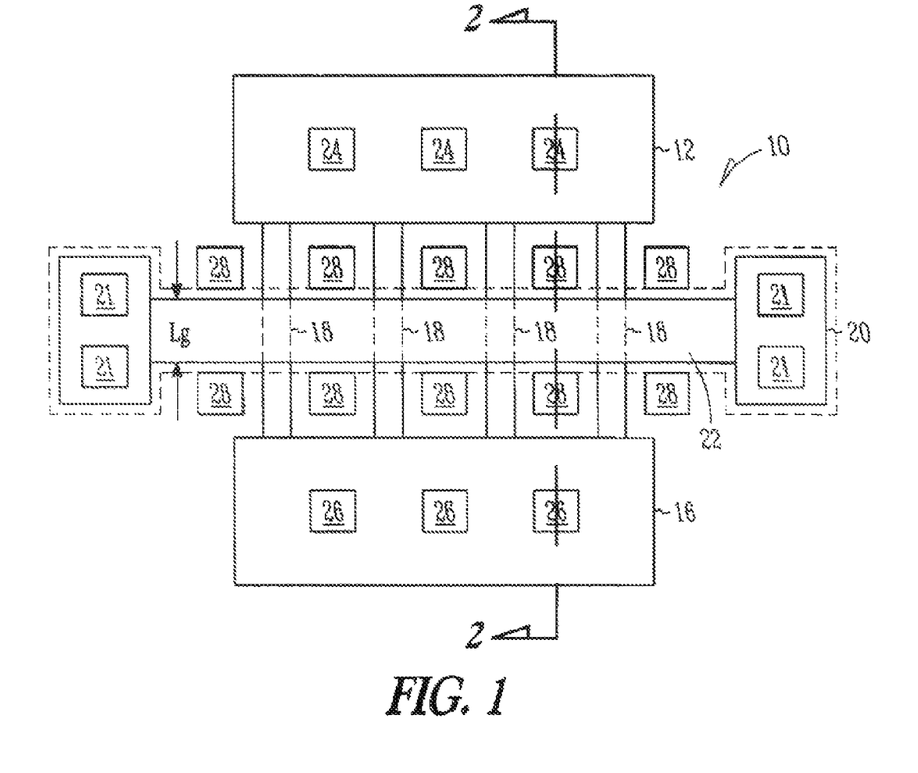
FIG. 1 is a top view of some embodiments of the invention showing dummy contacts as cooling elements in the open space between fins.
Figure 2:
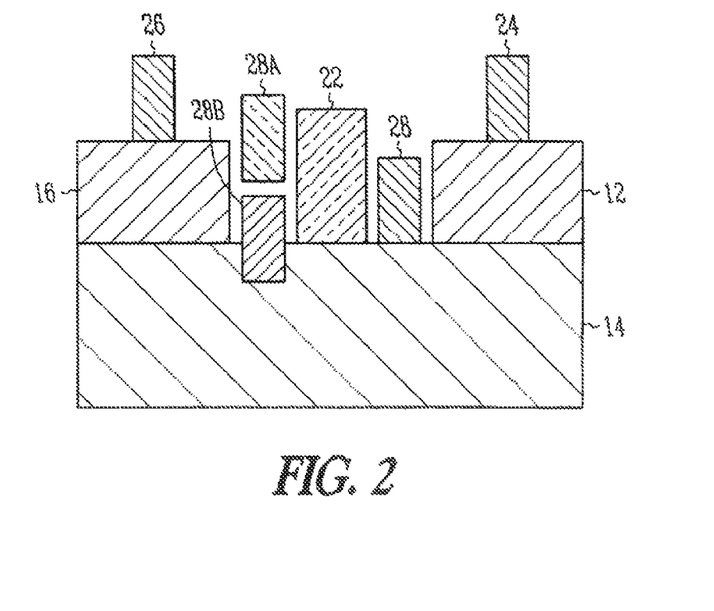
FIG. 2 is a cross sectional view taken along lines 2-2' of FIG. 1.

FIGS. 1 and 2 illustrate a semiconductor device 10 according to some embodiments of the invention. In some embodiments, semiconductor device 10 is a MuGFET (a multiple gate field effect transistor) device. In some embodiments, semiconductor device 10 is a MuGFET ESD (electrostatic discharge) protective device. In some embodiments, semiconductor device 10 is an I/O device.

FIG. 1 shows the layout of device 10. In some embodiments, device 10 is a Silicon-on-insulator semiconductor design where the active regions lie above an insulator layer which may be a buried oxide layer 14 formed above a silicon substrate which is not shown. In some embodiments, there is a drain region 12 which is shown in FIG. 2 as lying above buried oxide layer 14. In some embodiments buried oxide layer 14 is an insulator material such as $SiO_2$. In other embodiments the insulator material may be some other insulative material.

In some embodiments, a source region 16 is formed above buried oxide layer 14. In some embodiments, the thickness of the buried oxide layer is between about 40 nm and about 400 nm thick. In some embodiments, the thickness is about 145 nm. In some MuGFET devices 10, a fin region 18, formed from an active semiconductor material is coupled to provide a channel between the source 16 and drain 12 regions. In the embodiments of FIG. 1, four fins 18 are shown, it being realized that in practice, arrays of substantially parallel fins 18 may be formed having many more than four fin regions 18. In some embodiments an array of fins 18 are electrically coupled in parallel but are not geometrically substantially parallel to each other. In some embodiments, there may be 500 or more fin structures in a device. In other embodiments, semiconductor device 10 may comprise a single fin 18.

A gate region 20, 22 is operatively coupled to the channel region of fin 18 to control current flow through the channel between the source 16 and drain 12 regions. Gate contacts 21 are provided for applying gate voltages to gate 20, 22. The gate region includes an active gate region 22 which is operatively coupled to fin 18. The "width" of active gate region 22 is the length, $L_g$, of the gate along the channel within fin 18.

In some embodiments, a gate dielectric layer (not shown in FIG. 1) insulates active gate region 22 from fins 18 so that a voltage applied to gate region 20 controls the flow of current through a channel of fin 18 between drain 12 and source 16. In some embodiments, the thickness of the gate dielectric layer is between about 1 nm and about 10 nm. In some embodiments, the thickness of the gate dielectric layer is about 2 nm. Cooling from fin 18 to gate region 20, 22 happens via heat conduction through the very thin gate dielectric. Although the thermal conductivity of this dielectric material is less than that of silicon or metal, the heat will transfer sufficiently to the gate because the gate dielectric layer is so thin. Also, so-called high-K dielectrics will facilitate this better because they have a thermal conductivity better than $SiO_2$.

In some embodiments, the source 16, drain 12 and fin 18 are all formed on the buried oxide layer 14 by known etching and doping operations commonly used in the manufacture of CMOS devices. Because some low-cost embodiments of MuGFET manufacturing processes result in embodiments where the fin region 18 is largely devoid of deposited silicon, the relatively low thermal mass of the very thin fin region 18 results in extreme heating and possible damage to the device if an electrostatic event causes a large transient current flow, and an extreme rise in temperature in the channel of fin 18. Although the fin region 18 has a thin dielectric region and a gate layer 20 over its upper surface and side walls, the lateral space between adjacent fins is relatively empty so that there is no efficient heat transfer path away from fin 18. Because fin 18 has very little thermal mass, it has only a limited heat absorption capability.

In conventional bulk technology devices heat in the active region for large current flow is dumped into the substrate. In MuGFET devices the buried oxide layer blocks the flow of heat to the substrate because of poor thermal capacity and poor thermal conductivity of the insulating material such as $SiO_2$. In conventional MuGFET devices the primary heat sink for heat in the fin structure has been the fin itself, the gate and the surrounding intermediate oxide.

Electrical connection to the drain region 12 is provided in the embodiments shown in FIGS. 1 and 2 by contacts 24 which are placed above the drain region and may, in turn, be connected to a drain terminal (not shown) for the device. In some embodiments the contact material is tungsten. In other embodiments, other contact materials are used. In some embodiments, the contact materials have a specific heat capacity higher than that of the polysilicon of the gate and the silicon of the fin regions.

Electrical contact to the source region 16 is provided in the embodiments shown in FIGS. 1 and 2 by contacts 26 which are placed above the source region and may, in turn, be connected to a source terminal (not shown) for the device. Electrical contact to the gate region 20 is provided in the embodiments shown in FIGS. 1 and 2 by gate contacts 21 which may be coupled to a gate terminal (not shown) for the device. In some embodiments, the heat conducting capability of the contacts 21, 24 and 26 exceeds the heat conducting capacity of the buried oxide layer 14.

In the embodiment shown in FIG. 1, cooling elements 28 are formed in open spaces between fins 18. In some embodiments, cooling elements 28 are formed in the same process operation and from the same material as contacts 24 and 26. In some embodiments that material is tungsten. As distinguished from contacts 24 and 26 which are positioned on the drain and source regions to provide electrical connection, cooling elements 28 are placed in the open space between adjacent fins 18 and in close vicinity to the fins so that their higher specific heat capacity draws heat from fins 18. Any heat transfer to cooling elements 28 such as floating or dummy contacts 28 happens via oxide or other insulating material filling the open spaces between fins. The effectiveness of the heat transfer is enhanced by placing the cooling elements in close vicinity to the fins 18.

In some embodiments no electrical connection is made between cooling elements 28 and electrical terminals of the semiconductor device so that the cooling elements 28 can also be referred to as floating contacts 28 since they may be electrically floating while in close proximity to fins 18 to absorb heat generated in the fin region 18.

FIG. 2 shows, in cross-section, the cooling elements or floating or dummy contacts 28. Depending upon the manufacturing process steps used to form cooling elements 28 they may be positioned slightly above (28a) the buried oxide layer 14 or slightly embedded (28b) into the surface of the buried oxide layer 14. The cooling elements 28 may also be disposed on the surface of the buried oxide layer 14 as shown in FIG. 2. In all cases, however, cooling elements 28 provide an increase in thermal mass and thermal heat capacity for fin 18 to which they are closely adjacent.

Figure 3:
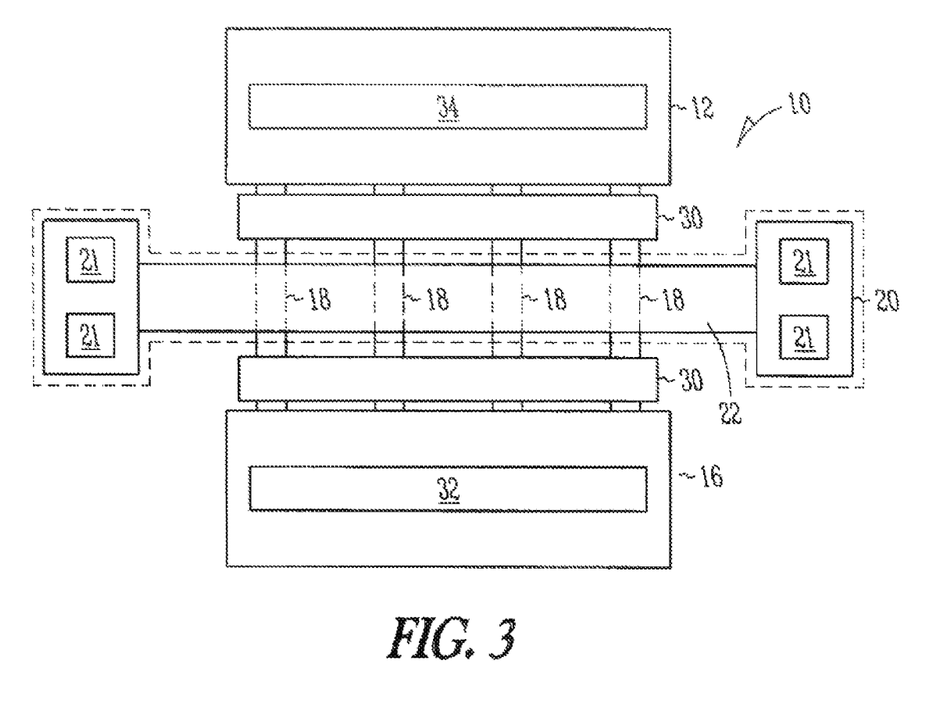
FIG. 3 is a top view of some embodiments of the invention showing dummy bar contacts as cooling elements formed above the fins.

In the embodiments of the semiconductor device 10 shown in FIG. 3, a basic semiconductor structure of source region 16, drain region 12 and gate regions 20, 22 are present. Instead of forming cooling elements 28 in the close vicinity of fins 18 in the spaces between fins 18, the embodiments shown in FIG. 3 provide bar contacts 30 placed above and extending transversely to at least two fins 18 of an array of substantially parallel fins 18. In some embodiments the bar contacts 30 may extend transversely but may extend over and beyond a single fin 18. In some embodiments, bar contacts 30 may have a width to length aspect ratio of about 1:2 to 1:10 and above. In some embodiments, the semiconductor may utilize just a single fin 18.

In the embodiments shown in FIG. 3, source and drain bar contacts 32 and 34 also provide further cooling by contributing a thermal mass which is greater than the thermal mass provided by contacts 26 and 24. Bar contacts 30 make a larger contribution to the heat dissipation capability than bar contacts 32 and 34 since those contacts 30 are in close vicinity to fins 18.

Figure 4:
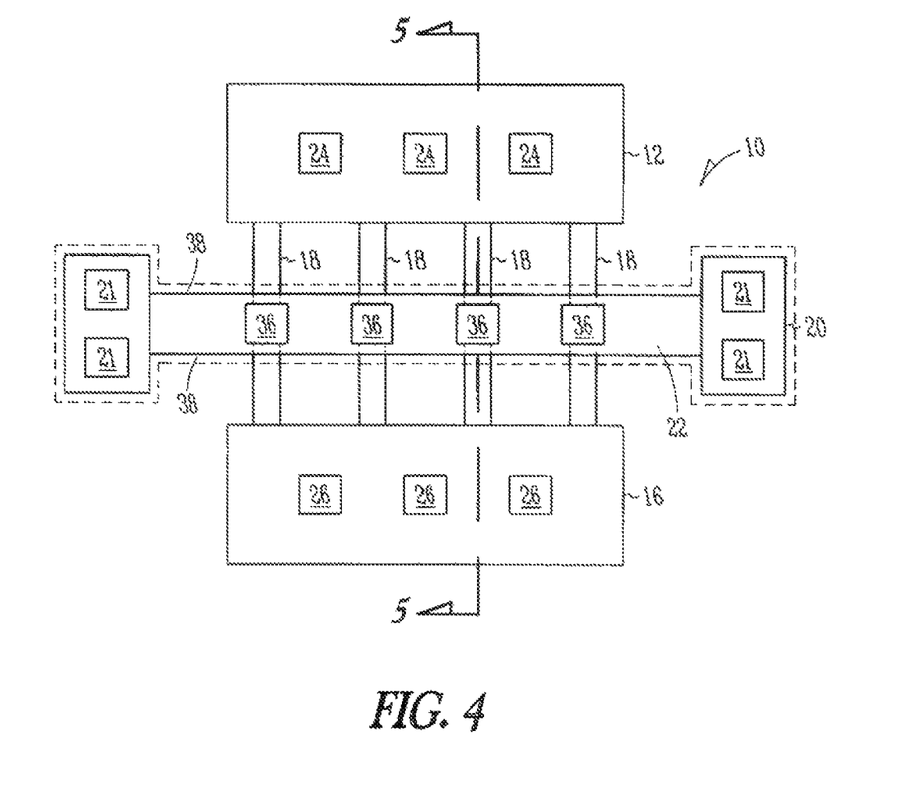
FIG. 4 is a top view of some embodiments of the invention showing dummy contacts as cooling elements placed above active gate regions.
Figure 5:
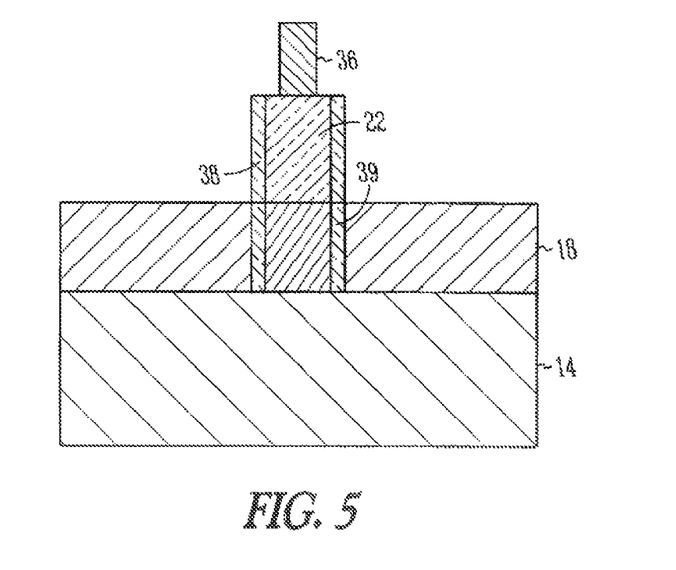
FIG. 5 is a cross sectional view taken along lines 5-5' of FIG. 4.

In the embodiments of the semiconductor device 10 shown in FIGS. 4 and 5, a basic semiconductor structure 10 comprised of source 16, drain 12 and gate 20, 22 is present. Additional cooling elements in these embodiments are dummy contacts 36 positioned above active gate regions 18. The dummy contacts 36 are thermally coupled to fins 18 but, in some embodiments, are not used for making electrical contact to gate region 22. In FIG. 5, layer 38 is a non-conductive spacer of which is formed adjacent active gate region 22. In some embodiments, layer 38 is formed from an oxide. In some embodiments, layer 38 is formed from a nitride.

Figure 6:
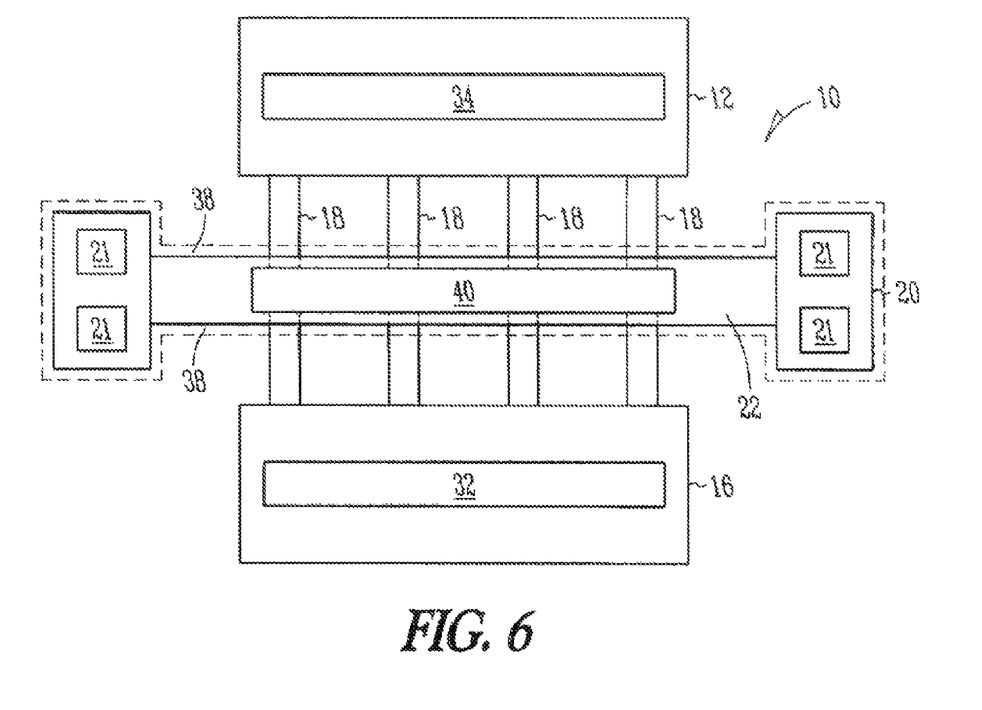
FIG. 6 is a top view of some embodiments of the invention showing dummy bar contacts as cooling elements formed above the active gate region and drain and source contacts.

In the embodiments of the semiconductor device 10 shown in FIG. 6, a basic semiconductor structure 10 comprised of source region 16, drain region 12 and gate region 20, 22 is present. Additional cooling elements in these embodiments are bar contacts 40 which provide added heat sink capacity to active gate region 22 which is itself thermally coupled to remove transient heat from fin 18. In some embodiments, the specific heat capacity of the bar contacts 40 makes a large contribution to the heat dissipation capability of the semiconductor device by removing heat from fins 18, such as during transient high current operation during ESD events. In some embodiments, source and drain bar contacts 32 and 34 are formed above source and drain regions 16 and 12 although they are less effective because they are not in close vicinity to fins 18.

Figure 7:
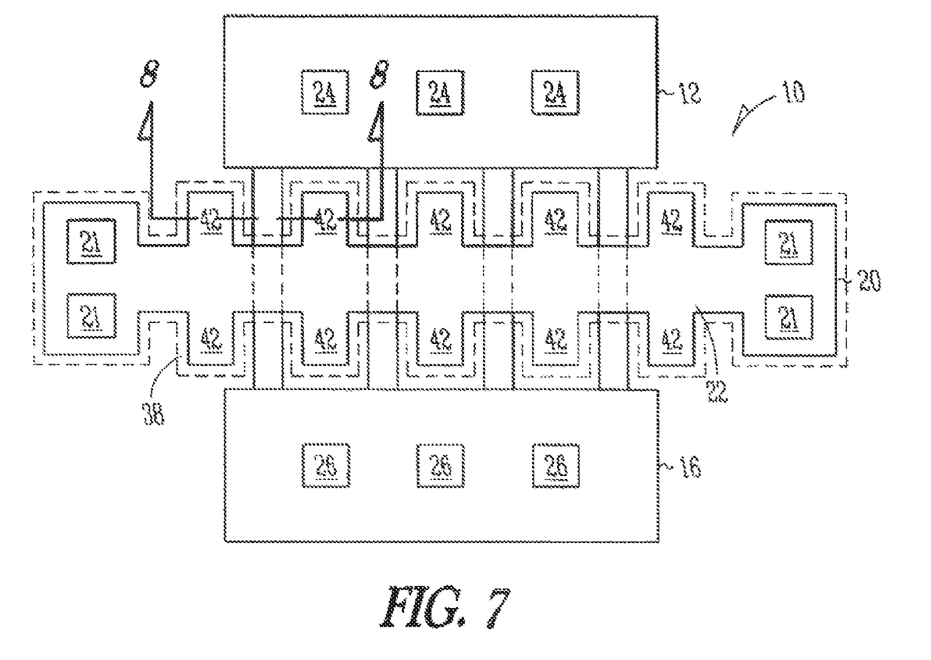
FIG. 7 is a top view of some embodiments of the invention showing gate extensions as cooling elements extending into the space between fins.
Figure 8:
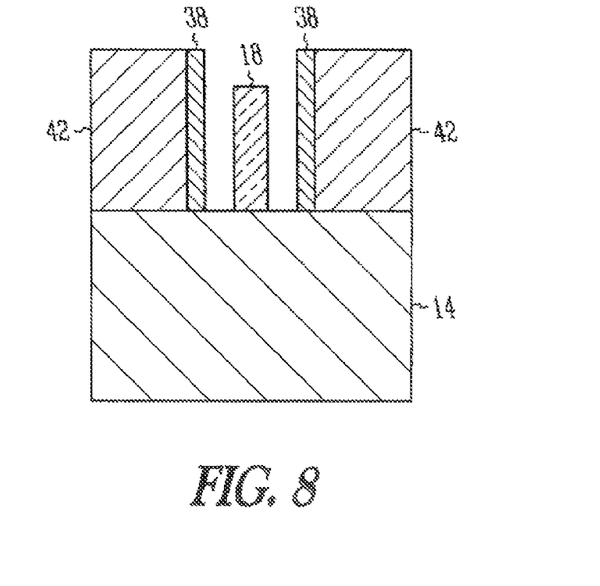
FIG. 8 is a cross sectional view taken along lines 8-8' of FIG. 7.

In the embodiments of the semiconductor device 10 shown in FIGS. 7 and 8, a basic semiconductor structure 10 comprised of source region 16, drain region 12 and gate region 20, 22 is present. Additional cooling elements in these embodiments are gate extensions 42 which stretch into the empty region between adjacent parallel fins 18. Gate extensions are spaced from the multiple fin regions 18 as well as portions of the source and drain regions 16 and 12, respectively. Gate extensions 42 transfer heat from the gate region 20, 22. If the extensions 42 are in close proximity to the fins 18, or even overlap them in some embodiments, the extension will also absorb heat from those portions of the heated fins not under the active gate region 22.

Figure 9:
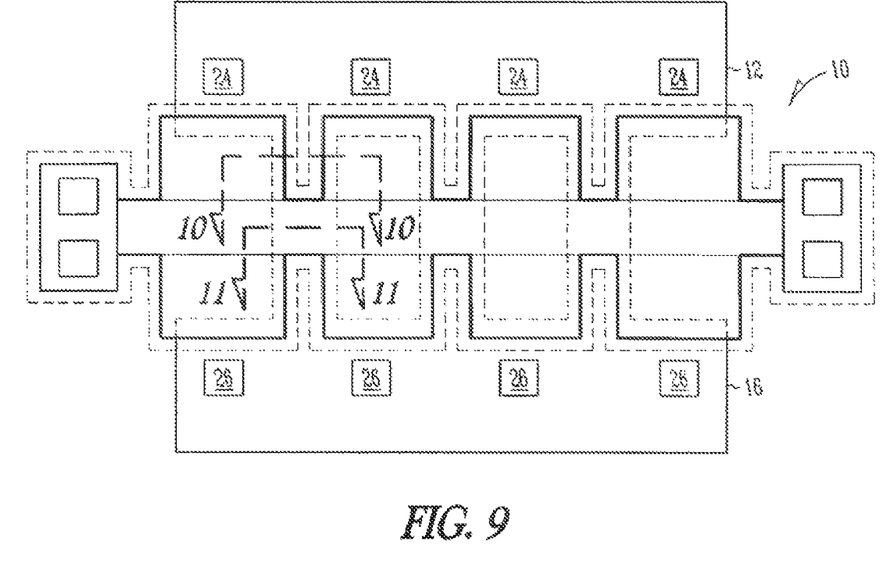
FIG. 9 is a top view of some embodiments of the invention showing gate extension regions as cooling elements overlapping at least two fins.
Figure 10:
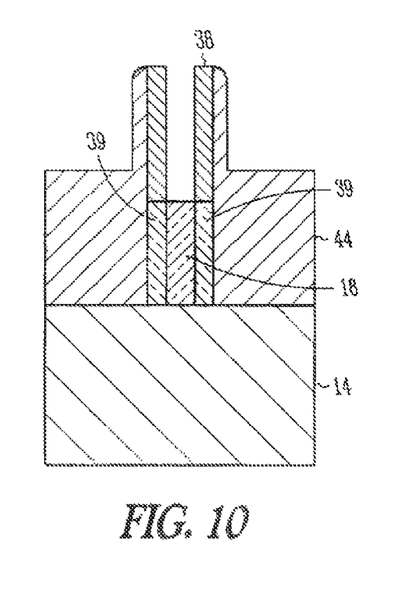
FIG. 10 is a cross sectional view taken along lines 10-10' of FIG. 9.
Figure 11:
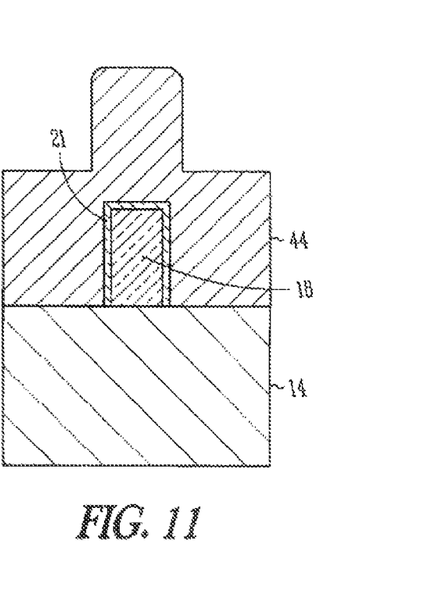
FIG. 11 is a cross-sectional view taken along lines 11-11' of FIG. 9.

In the embodiments of the semiconductor device 10 shown in FIGS. 9 through 11, a basic semiconductor structure 10 comprised of source region 16, drain region 12 and gate region 20, 22 is present. A halo/extension region 39 is shown adjacent fin 18. In FIG. 11, a layer of gate dielectric is shown adjacent fin 18. Additional cooling elements in these embodiments are gate extensions 44 which overlap multiple fin regions 18 as well as portions of the source 16 and drain 12 regions.

Figure 12:
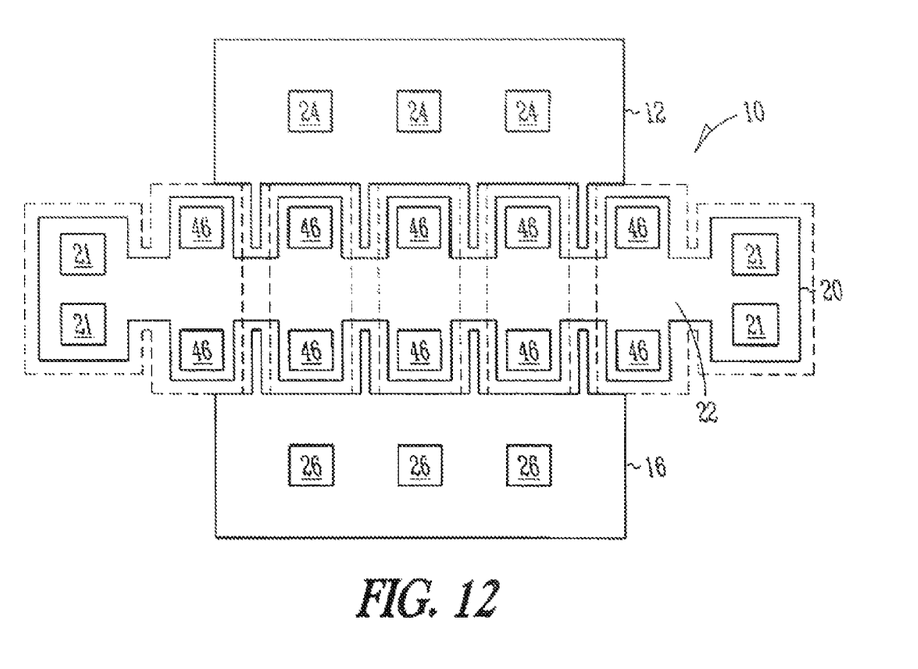
FIG. 12 is a top view of some embodiments of the invention having gate extensions and dummy contacts as cooling elements in the open space between fins.

In the embodiments of the semiconductor device 10 shown in FIG. 12, a basic semiconductor structure 10 comprised of source region 16, drain region 12 and gate region 20, 22 is present. Additional cooling elements in these embodiments are gate extensions 44 which, with the spacers 38, adjoin multiple fin regions 18 as well as portions of the source 16 and drain 12 regions as shown in FIGS. 9 through 11. Some embodiments illustrated in FIGS. 9-12 also employ additional cooling elements such as additional contacts 46 formed above the gate extensions 44 to provide still further heat extraction and absorption capacity.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A semiconductor device, comprising:
   a fin region having a channel region, said channel region electrically coupled between a source region and a drain region;
   a gate region electrically coupled to said channel region; and
   a cooling element thermally coupled to said fin region, said cooling element disposed above a top surface of an electrically insulating layer, said cooling element not being part of said fin.

2. The device of claim 1, wherein said cooling element is disposed on said electrically insulating layer.

3. The device of claim 1, wherein said cooling element draws heat from said fin region.

4. The device of claim 1, wherein said cooling element has specific heat capacity equal to or greater than the specific heat capacity of the fin region.

5. The device of claim 1, wherein said cooling element is electrically isolated from channel region.

6. The device of claim 1, wherein said cooling element is electrically isolated from said source and drain regions.

7. The device of claim 1, wherein said cooling element is electrically isolated from said gate region.

8. The device of claim 1, wherein said cooling element is electrically coupled to said gate region.

9. The device of claim 1, wherein said cooling element electrically floats.

10. The device of claim 1, wherein said cooling element is in close vicinity to said fin region.

11. The device of claim 1, wherein said cooling element has a specific heat capacity equal to or greater than the specific capacity of said fin region.

12. The device of claim 1, wherein said fin region is supported by said electrically insulating layer.

13. The device of claim 12, wherein said electrically insulating layer is a buried oxide layer.

14. The device of claim 1, wherein said fin region is one of an array of fin regions.

15. The device of claim 1, wherein said cooling element is disposed above said gate region.

16. The device of claim 1, wherein said semiconductor is a finFET device.

17. A semiconductor device, comprising:
    a substrate;
    a fin region supported by said substrate, said fin region having a channel region, said channel region electrically coupled between a source region and a drain region;
    a gate region electrically coupled to said channel region;
    a cooling element thermally coupled to said fin region; and
    a electrically insulating layer between said cooling element and said substrate, said electrically insulating layer thermally isolating said cooling element from said substrate, said cooling element not being a part of said fin.

18. The device of claim 17, wherein said cooling element draws heat from said fin region.

19. The device of claim 17, wherein said cooling element is electrically isolated from channel region.

20. The device of claim 17, wherein said cooling element is electrically isolated from said source and drain regions.

21. The device of claim 17, wherein said cooling element is electrically isolated from said gate region.

22. The device of claim 17, wherein said cooling element is electrically coupled to said gate region.

23. The device of claim 17, wherein said cooling element electrically floats.

24. The device of claim 17, wherein said cooling element is in close vicinity to said fin region.

25. The device of clam 17, wherein said cooling element has a specific capacity equal to or greater than the specific capacity of said fin region.

26. The device of claim 17, wherein said electrically insulating layer is between said fin region and said substrate.

27. The device of claim 17, wherein said electrically insulating layer is a buried oxide layer.

28. The device of claim 17, wherein said semiconductor device is a finFET device.

29. The device of claim 1, wherein said cooling element is lateral to or above said fin region.

30. The device of claim 1, wherein said cooling element does not underlie said fin region.

31. The device of claim 17, wherein said cooling element is lateral to or above said fin region.

32. The device of claim 17, wherein said cooling element does not underlie said fin region.

* * * * *